United States Patent [19]

Ballato

[11] Patent Number: 4,994,772
[45] Date of Patent: Feb. 19, 1991

[54] ACOUSTIC CHARGE TRANSPORT PROCESSOR

[75] Inventor: Arthur Ballato, Long Branch, N.J.

[73] Assignee: The United States of America as represented by the Secretary of the Army, Washington, D.C.

[21] Appl. No.: 263,298

[22] Filed: Oct. 27, 1988

[51] Int. Cl.$^5$ ............... H03H 9/44; H01L 29/816; H01L 41/00
[52] U.S. Cl. .................................. 333/152; 333/165; 357/24; 310/313 R
[58] Field of Search ............................. 333/150–154, 333/165, 166, 193–196; 310/313 R, 313 B, 313 C, 313 D; 364/821; 357/24

[56] References Cited

U.S. PATENT DOCUMENTS

| | | | |
|---|---|---|---|
| 3,795,879 | 3/1974 | Whitehouse et al. | 310/313 R X |
| 3,800,247 | 3/1974 | Tancrell et al. | 333/151 |
| 3,845,419 | 10/1974 | Nudd | 310/313 R X |
| 4,389,590 | 6/1983 | Whitlock | 333/154 X |
| 4,499,393 | 2/1985 | Stokes et al. | 333/154 X |
| 4,611,140 | 9/1986 | Whitlock et al. | 333/154 X |
| 4,633,117 | 12/1986 | Bloch et al. | 310/313 B |
| 4,633,285 | 12/1986 | Hunsinger et al. | 357/24 LR X |
| 4,639,695 | 1/1987 | Mariani et al. | 333/193 X |
| 4,799,244 | 1/1989 | Mikoshiba et al. | 357/30 R |

OTHER PUBLICATIONS

Paper entitled "Monolithic GaAs Acoustic Charge Transport Devices", presented at the 1982 Ultrasonics Symposium Proceedings by Michael J. Hoskins and Bill J. Hunsinger, pp. 456–460.
Book on "Surface-Wave Devices for Signal Processing" by David P. Morgan, 1985, pp. 256–267.

Primary Examiner—Benny Lee
Attorney, Agent, or Firm—Michael Zelenka; Robert A. Maikis

[57] ABSTRACT

An acoustic charge transport (ACT) device is easily constructed to provide for variable carrier frequency operation or, alternatively, for variable time delays. Variable carrier frequency operation in an ACT device is achieved by incorporating a two dimensional dispersive transducer array which has an interdigitated finger arrangement. This array has a graded periodicity or finger spacing that varies along the length of the array and also has the fingers placed at a 45 degree angle with respect to the length of the array. Because of the varying spacing of the electrode fingers, different spatial regions in the piezoelectric substrate are preferentially excited reflecting the presence of specific frequency components in an applied input signal. A variable time delay is similarly achieved in an ACT device by incorporating a two dimensional interdigital transducer array having fingers with a graded periodicity. The finger spacings in this transducer array are placed at a 90 degree angle with respect to the length of the array. By simply changing the frequency of the input signal in the selected ACT device, variable carrier frequency operation and variable time delays are provided.

3 Claims, 4 Drawing Sheets

ACOUSTIC CHARGE TRANSPORT PROCESSOR

The invention described herein may be manufactured, used, and licensed by or for the Government for Governmental purposes without the payment to me of any royalties thereon.

TECHNICAL FIELD OF THE INVENTION

This invention relates generally to acoustic charge transport devices and more particularly to an acoustic charge transport device capable of variable time delays and/or variable carrier frequency operation.

DESCRIPTION OF THE PRIOR ART

Acoustic charge transport (ACT) devices are relatively new in the field of microelectronic device technology. An ACT device utilizes and combines the technologies of semiconductors with that of microwave circuits and ultrasonics to perform its functions. It is therefore a significant departure from most of today's microelectronic signal processing devices.

ACT devices were disclosed in an article entitled "MONOLITHIC GaAs ACOUSTIC CHARGE TRANSPORT DEVICES," by M. J. Hoskins and B. J. Hunsinger, in the 1982 ULTRASONICS SYMPOSIUM PROCEEDINGS, pp 456-460, held October 27-29, 1982 in San Diego, Calif. As described in this article, the ACT concept is based on the large signal acousto-electric interaction between electrons and surface acoustic waves (SAWs) in a piezoelectric semiconductor such as gallium arsenide. In an ACT device, buried channel electron transport is accomplished at the velocity of sound using a traveling wave electric field created by a SAW generated directly in the semiconductor. These SAWs are utilized to transport samples of a signal or charge packets which are injected directly therein.

An ACT device performs computational or analytic functions by providing a number of elements along the surface of the substrate of the semiconductor in such a manner that many functions can be performed simultaneously. The SAW, acting as an electronic signal conveyer, is introduced along a path adjacent to these elements. Electromagnetic, video, or audio signals, for example, are converted to a series of electron packets which are then injected into the conveyer and transported from element to element until the desired processing or analysis is complete.

Although many functions are available with the ACT devices known in the art, these devices have the undesirable limitation of being single carrier frequency devices having a fixed time delay. Many capabilities of the fundamental device are not yet available because of this limitation. It is desirable, therefore, to provide ACT devices that are capable of variable carrier frequency operation and have easily variable delay times.

SUMMARY OF THE INVENTION

In accordance with the invention, an ACT device provides for variable carrier frequency operation and in a slightly different embodiment provides for variable time delays.

As used in the specification and claims herein, the term "two dimensional array" refers to an array which when deposited or mounted on a substrate surface has little or no height or thickness which extends above the substrate surface so that the array has essentially only the two dimensions of length and width.

Variable carrier frequency operation in an ACT device is achieved by incorporating a two dimensional dispersive transducer array which has an interdigitated finger arrangement. This array has a graded periodicity or finger spacing that varies along the length of the array. These finger spacings are placed at a 45 degree angle with respect to the length of the array. Because of the varying spacing of the electrode fingers, different spatial regions in the piezoelectric substrate are preferentially excited upon the application of an input signal comprising one or more of a multiplicity of frequency components. The frequency dependent surface acoustic waves generated thereby are sorted out spatially and in a parallel manner then propagate under an electrode or ohmic input contact which packetizes these waves with signal information. After a period of delay determined by the length of a transport channel, the packets of information are extracted or detected by an output ohmic contact resulting in the generation of the desired delayed output signal.

Through use of such a dispersive transducer, variable carrier frequency operation in an ACT device is therefore achieved. The signal applied to this dispersive transducer also need not be very precise in frequency or stable for satisfactory operation. The signal may be either a modulated input frequency or a varying frequency representing information or even a carrier having a rather imprecise frequency. As long as the frequency of the source is within the overall bandwidth of the dispersive transducer, at some point along its length those frequency components in the input signal will be strongly transduced and will enter under the input contact and travel through the transport channel of the ACT device.

Variable time delays in an ACT device is similarly achieved by incorporating a two dimensional interdigital transducer array having fingers with a graded periodicity. The fingers in this array are placed at a 90 degree angle with respect to the length of the array. As in the above embodiment, because of the varying spacing of the electrode fingers, different spatial regions in the piezoelectric substrate are preferentially excited upon the application of an input signal comprising a multiplicity of frequency components. The corresponding surface acoustic waves are thereby produced upon the application of this input signal containing one or more of the multiplicity of frequency components. These frequency dependent surface acoustic waves are transducted at varying distances along the device preferentially according to the finger spacing of the transducer. The surface acoustic waves then propogate under an input contact located parallel to the electrode fingers for packet injection in a serial manner and at different times and will similarly arrive at the output contact for packet extraction at different times. Thus by simply changing the frequency of the input signal, a variable time delay in the operation of this ACT device is provided.

In yet another different embodiment of the invention, an ACT device is arranged such that it combines in a two dimensional configuration two dispersive transducers and their respective input and output contacts such that each structural element is mutually perpendicular to its counterpart. In that ACT devices are nonlinear, the surface acoustic waves generated in each of the two transducers mutually interact with each other. And because of the nonlinearities involved, the signals that appear at the outputs are mixtures of the two separate inputs. Through use of two such dispersive transducers, two-dimensional convolution and correlation is easily achieved.

BRIEF DESCRIPTION OF THE DRAWING

The invention and its mode of operation will be more clearly understood from the following detailed description when read with the appended drawing in which.

DETAILED DESCRIPTION OF THE INVENTION

Figure 1:
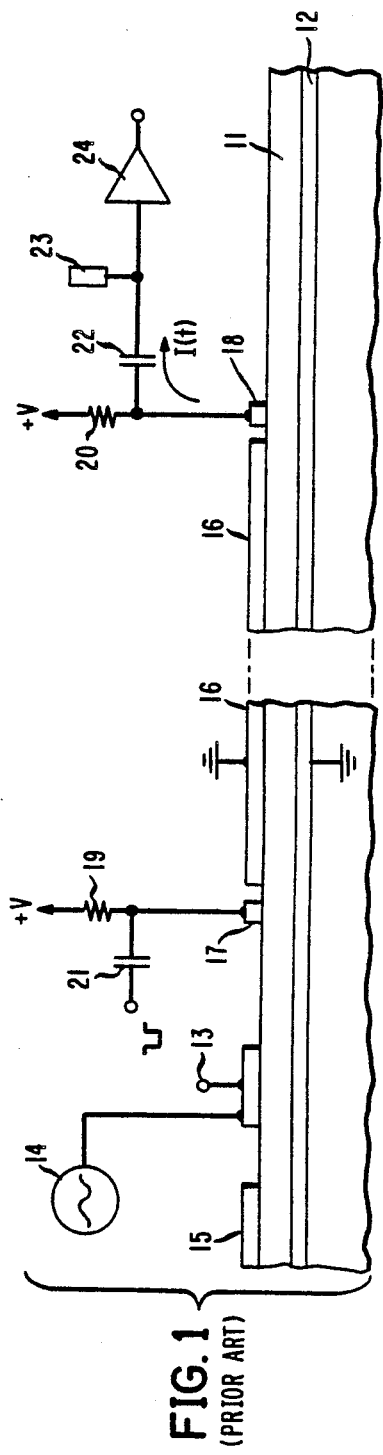
FIG. 1 shows a side view of the prior art ACT device structure illustrating its geometry and bias scheme.
Figure 2:
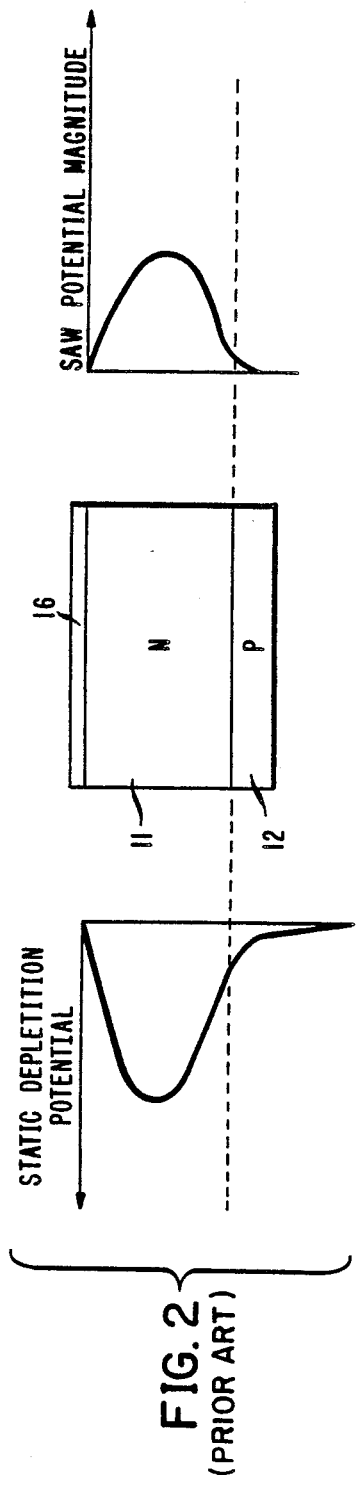
FIG. 2 shows the potential distributions within the depleted channel of the ACT device structure shown in FIG. 1.
Figure 3:
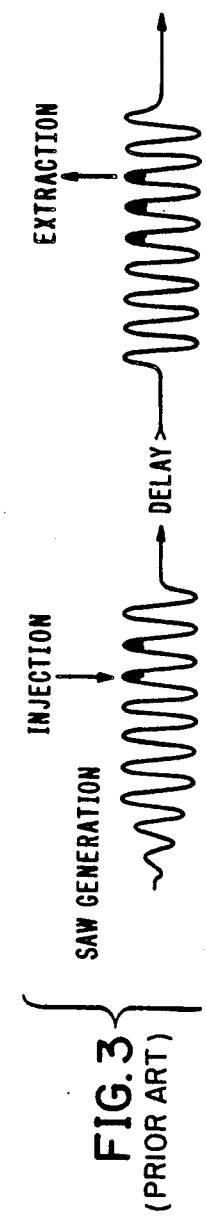
FIG. 3 shows the injection and extraction of electron packets in a traveling wave generated by the ACT device shown in FIG. 1.

Referring now to FIGS. 1, 2 and 3, there is illustrated the device geometry, electrical bias and transport process of a prior art ACT device 10. An epitaxial gallium arsenide n-p layer configuration is grown on a semi-insulating substrate such that the thickness of a n-type layer 11 is roughly one-half to one acoustic wave length thick. This n-type layer is deposited on a thin p-type buffer layer 12. A transducer 13, connected to an oscillatory generator 14, is affixed to the surface of the n-type layer 11 for surface wave excitation. This acoustic transducer is an interdigital array with electrode fingers that have a uniform spacing interval and is resonate only at a single frequency. An acoustic absorber 15 comprising a lossy material is also provided on the surface for attenuating the waves that are generated by the transducer and travel in a direction opposite the one of interest.

A transport channel in the n-type layer 11 is defined by a Schottky barrier channel plate 16 on the surface of the n-type layer. Lateral channel confinement is achieved by etching the edges of the channel down to the p-layer 12. Ohmic electrodes or contacts 17 and 18 at the respectively input and output ends of the channel form lateral Schottky barrier diodes with respect to the channel plate 16, permitting electron injection and extraction during operation. Electron detection rather than extraction is also possible and is preferred in some applications.

For clarity of operation, the channel structure may be considered to be a giant Schottky barrier field effect transistor (FET) with a very long gate. Operating bias +V is provided via resistors 19 and 20 respectively to the contacts 17 and 18 so as to severely pinch off the channel under the condition of zero drain source voltage. I(t), the output current derived from contact 18, is zero under this condition. Under this bias condition, the channel is deeply depleted of mobile charge and the depletion potential forms an electrostatic potential well for electrons. These electrons tend to confine any re-jected charge to the center of the n-type layer 11 as shown graphically in FIG. 2. The surface acoustic wave (SAW) potential magnitude, also shown graphically in FIG. 2, is screened at the surface by the channel plate 16 and by any mobile holes in the p-type layer 12. The resulting SAW potential also acts to confine injected electrons near the channel center.

In operation, the superposition of the SAW and depletion potentials creates a series of two dimensional potential wells which propagate through the channel at the SAW velocity. As shown in FIG. 3, electrons are injected into these potential wells by applying an input signal such as a negative-going pulse to the input contact 17 via a capacitor 21. This causes the depletion region at the input end of the channel to collapse and the injected electrons are quickly bunched by the traveling wave potential into concise packets which are trapped by the SAW and constrained to move precisely through the channel at the sound velocity. After transport through the length of the channel, the electron packets are rapidly swept out of the wave by the large electric fields associated with the reverse biased output diode resulting in the generation of the desired delayed output signal. This output signal is provided to a detection circuit comprising a resistor 20, a capacitor 22, a frequency rejection stub 23 tuned to the frequency of the oscillatory generator 14 and also an output amplifier 24.

Figure 4:
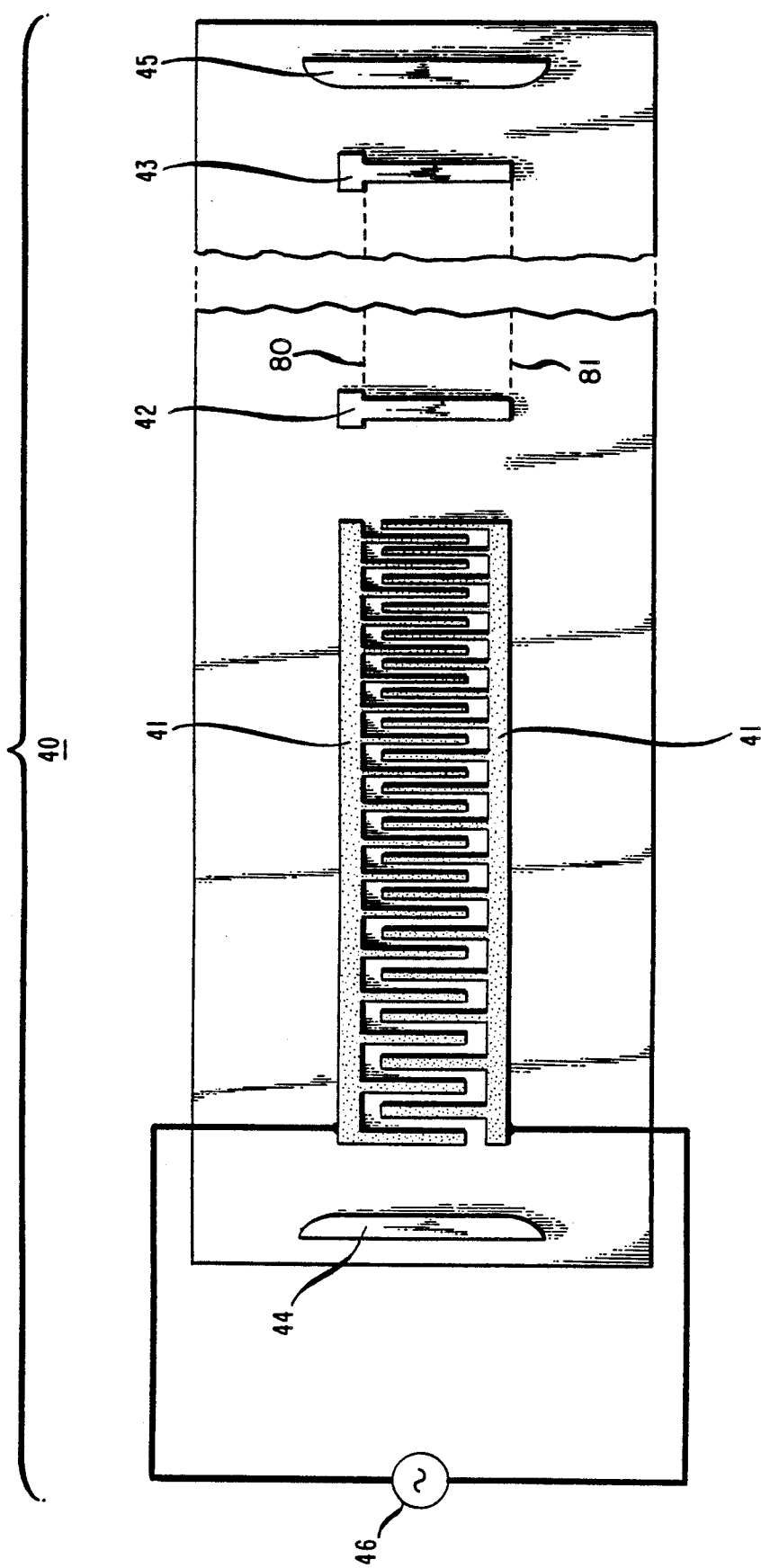
FIG. 4 shows a first embodiment of an ACT device with a SAW source that is comprised of a dispersive transducer in accordance with the invention.

Referring next to FIG. 4, there is shown an ACT device 40 with a SAW source that is comprised of a dispersive transducer in accordance with the invention. An overhead illustration shows the major functional structural elements which include the dispersive transducer 41, an input contact 42 and an output contact 43 and acoustic absorbers 44 and 45. An oscillatory generator 46 is connected to the dispersive transducer 41 for providing surface wave excitation. The ACT device 40 also includes a transport channel disposed between the input and 43. The approximate lateral boundaries of the transport channel are shown schematically by the dot-dash lines 80 and 81 in FIG. 4.

Unlike the ACT device of FIG. 1, where the acoustic transducer is an interdigital array with electrode fingers that are of uniform spacing interval and therefore resonate only at a single frequency, the transducer 41 uses an interdigital array having fingers with a graded periodicity or spacings that vary along its length. As a result of the nonuniform spacing of the transducer finger pattern, the surface acoustic waves may be produced responsive to a multitude of different frequency signals from the oscillatory generator 46. These surface acoustic waves are transducted at varying distances along the device preferentially according to this finger spacing. The resulting surface acoustic waves will therefore pass under the input contact 42 for packet injection at different times and will similarly arrive at the output contact 43 for packet& extraction at different times. Thus by simply changing the frequency signal supplied by the oscillatory generator 46, a variable time delay is provided in the operation of the ACT device 40.

Figure 5:
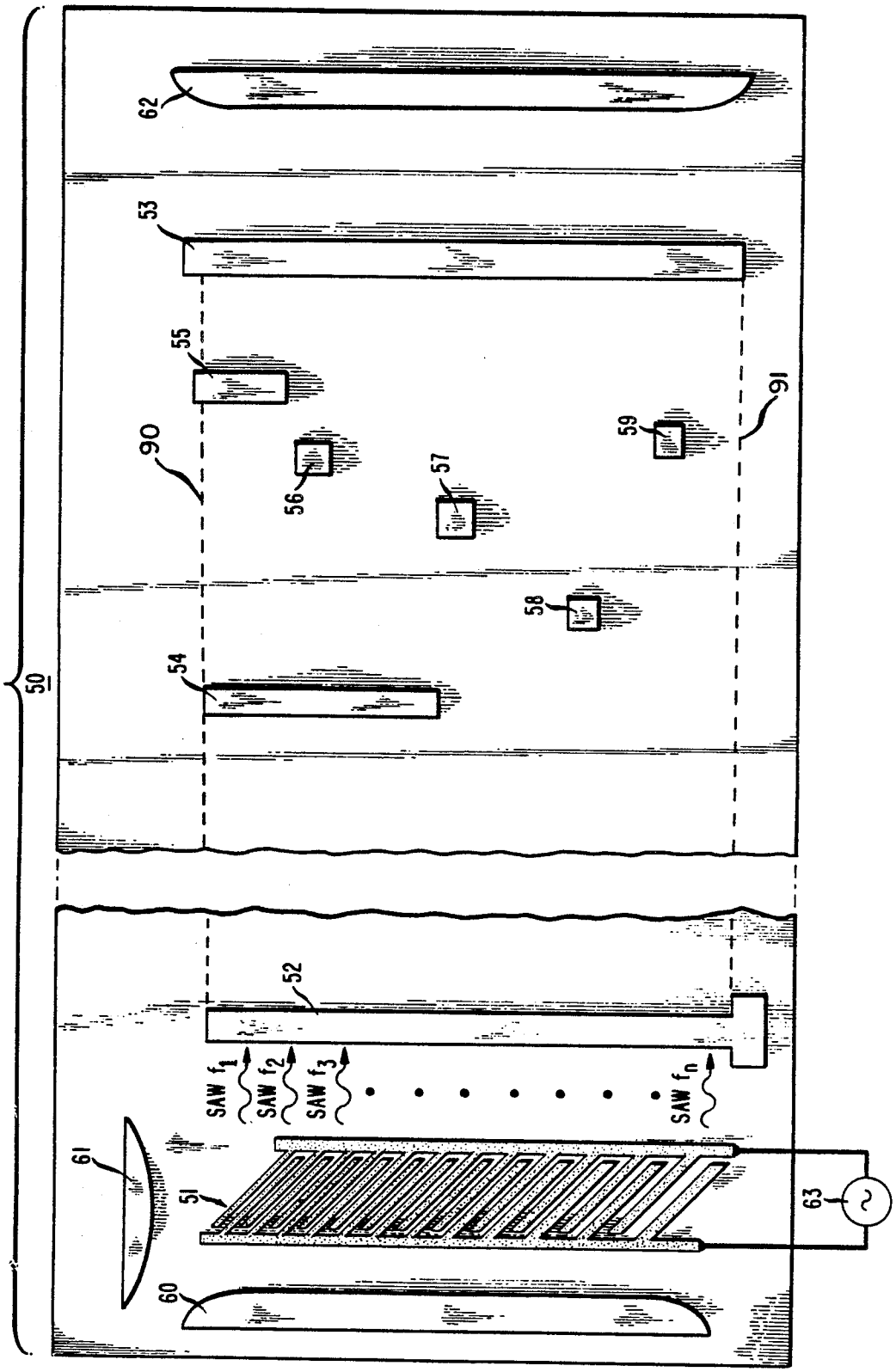
FIG. 5 shows a second embodiment of an ACT device with a SAW source that is comprised of a dispersive transducer in accordance with the invention.

Referring next to FIG. 5, there is shown an ACT device 50 with a SAW source that is comprised of a dispersive transducer in accordance with the invention. An overhead illustration shows the major functional structural elements which include the dispersive transducer 51, an input contact 52, multiple output contacts 53 through 59 and acoustic absorbers 60 through 62. An oscillatory generator 63 is connected to the dispersive transducer 51 for providing surface wave excitation. The ACT device 50 also includes a transport channel, the approximate lateral boundaries of which are shown schematically by the dot-dash lines 90 and 91 in FIG. 5.

As shown in FIG. 5, a two dimensional array transducer 51 comprised of an interdigitated finger arrangement and has finger spacings that vary along the length of the array. These fingers are placed at an angle of 45 degrees with respect to the length of the array, similar to the geometry of a reflective array compressor (RAC) used in a surface wave device. In general, RACs are inclined shallow grooves with graded periodicity and arranged to reflect surface waves by some angular amount. A more detailed description of RACs is available in a book entitled "SURFACE-WAVE DEVICES FOR SIGNAL PROCESSING," by David P. Morgan, Published by Plessey Research LTD, Towcester, U.K., 1985.

When an input signal comprising one or more of a multiplicity of frequency components is applied to the transducer 51, the resulting surface acoustic waves are sorted out spatially and the individual surface waves then propagate at the same time under the single long input contact 52 adjacent to the transducer 51. Contact 52 provides the means to packetizing the surface waves with signal information.

A single long output contact 53 provides an integrated output for the ACT device 50. The ACT device 50 also advantageously includes a multiplicity of shorter output contacts 54 through 59 for providing separate and distinct outputs. Depending on the application, these shorter contacts may exceed a hundred or more. When an excitation signal containing a multitude of frequencies is impressed on the ACT device 50, the different spatial regions are preferentially excited because of the varying spacing of the electrode fingers, and the frequency dependent surface acoustic waves, SAW $f_1$, SAW $f_2$, SAW $f_3$..., are sorted out as depicted in FIG. 5. When these individual surface acoustic waves interact with the input signal from the input contact 52 and carry the packets of electrons through the transport channel, the output provided at contact 53, a single long stripe, is simply the integrated packetized signal information contained in each of the individual surface acoustic waves. The separate output provided at each of the multiplicity of output contacts 54 through 59, however, allows the individual surface acoustic wave, or a combination of these waves, to have a separate output which is advantageous for certain types of signal processing One obvious advantage of having a device such as ACT 50, where the input transducer is dispersive, is that the signal applied to this transducer need not be very precise in frequency. It also need not be very stable for satisfactory operation. It can be either be a modulated input frequency or a varying frequency representing information or even a carrier having a rater imprecise frequency. As long as the frequency of the source is within the overall bandwidth of the dispersive transducer, at some point along its length those frequency components from the oscillator will be strongly transduced and will enter under the input contact and travel through the channel portion of the ACT device. Such operation is not possible for a single broadband input transducer in the traditional ACT device. While attempting to operate broadband, the transduction efficiency for the surface acoustic wave is very low, since no part of the transducer structure is then resonant.

Figure 6:
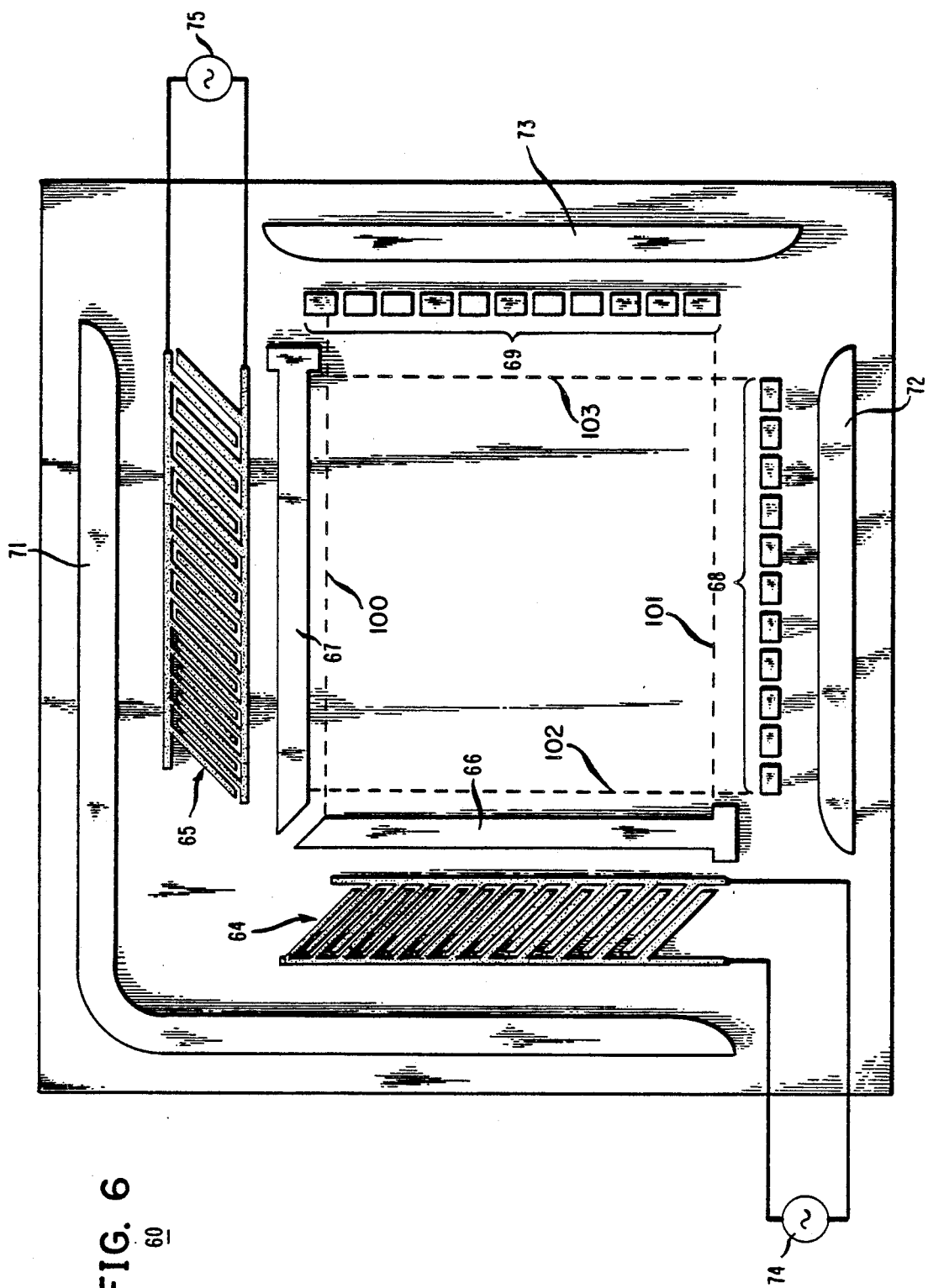
FIG. 6 shows a variation of the ACT device shown in FIG. 5 in accordance with the invention.

With reference next to FIG. 6, there is shown an ACT device 60 with a SAW source that is comprised of two dispersive transducers in accordance with the invention. An overhead illustration shows the major functional structural elements which include the dispersive transducers 64 and 65, input contacts 66 and 67, a first and a second linear array of multiple output contacts 68 and 69, and acoustic absorbers 71 through 73. oscillatory generators 74 and 75 are respectively connected to the dispersive transducers 64 and 65 for providing surface wave excitation.

The ACT device 60 is a variation of ACT device 50 disclosed herein above and shown in FIG. 5. The ACT device 60 combines in a two dimensional embodiment two dispersive transducers, of the type shown in FIG. 5 and described hereinabove, and their respective input and output contacts such that each structural element is mutually perpendicular to its counterpart.

The output contacts may be positioned at other than their placement on the surface as shown in the drawing of the ACT device 60 to allow a two dimensional freedom for certain types of signal processing. For example, one or more of the output contacts may be positioned to respond to a first frequency dependent surface acoustic wave generated by transducer 64 and a second lower or higher frequency dependent surface acoustic wave generated by transducer 65.

ACT devices are nonlinear. The surface acoustic waves generated in transducer 64 and transducer 65 mutually interact with each other. Because of the nonlinearities involved, the signals that appear at the outputs are mixtures of the two separate inputs. The approximate lateral boundaries of the transport channel for transducer 64 are shown by the dot-dash lines 100 and 101 and the approximate boundaries of the transport channel for transducer 65 are shown by the dot-dash lines 102 and 103 in FIG. 6. Such an arrangement as ACT device 60 therefore has application for two-dimensional convolution and correlation.

Modifications of the ACT device disclosed herein are possible and may obviously be implemented by those skilled in the art without departing from the spirit and scope of the invention. It is to be understood, therefore, that within the scope of the appended claims, the invention may be practiced otherwise than as specifically described.

What is claimed is:

1. An acoustic charge transport device comprising:
   a piezoelectric semiconductor having a channel for transporting charge packets;
   dispersive transducer means for generating multiple surface acoustic waves in a first plurality of spatial regions in the semiconductor material, the surface acoustic waves being generated near a first portion of the channel and propagating through the channel to a second portion of the channel, said dispersive transducer means for generating multiple surface acoustic waves comprising a first and a second two dimensional array transducer arranged mutually perpendicular to each other;
   oscillatory generator means coupled to said transducer means for providing a variable frequency signal for activating the dispersive transducer means, the dispersive transducer means generating selectively in different spatial regions of the first plurality of spatial regions a surface acoustic wave representative of the frequency provided to the dispersive transducer means by the oscillatory means;

means adjacent to the first portion of the channel for injecting the charge packets in a potential well created by the surface acoustic waves, said charge packet injecting means adjacent to the first portion of the channel including a first and a second electrode arranged mutually perpendicular to each other; and means adjacent to the second portion of the channel, defining a second plurality of spatial regions in the semiconductor material, for detecting the charge packets in each of the multiple surface acoustic waves, the dispersive transducer means providing a time delay between the injecting of the charge packets and the detecting of the charge packets.

2. The acoustic charge transport device as in claim 1 wherein the charge packet detecting means adjacent to the second portion of the channel include a first and a second linear array of multiple output electrodes, the first and second linear arrays being arranged mutually perpendicular to each other.

3. The acoustic charge transport device as in claim 2 wherein said piezoelectric semiconductor material comprises gallium arsenide.

* * * * *